United States Patent [19]

Woodham et al.

[11] 3,940,273

[45] Feb. 24, 1976

[54] SEQUENTIAL PEELING FOR MASK PREPARATION FOR FABRICATION OF MICROWAVE CIRCUITS

[76] Inventors: Loyd L. Woodham, 1303 Walnut St., Albertville, Ala. 35950; Raymon H. Aldridge, 219 Longwood Drive SW., Huntsville, Ala. 35801

[22] Filed: May 8, 1973

[21] Appl. No.: 358,424

[52] U.S. Cl. ............... 96/27 R; 96/36.2; 96/38.3; 96/41; 96/44
[51] Int. Cl.² ................. G03C 5/04; G03C 5/00
[58] Field of Search ............ 96/27 R, 41, 38.3, 44, 96/36.2; 161/3, 6

[56] References Cited
UNITED STATES PATENTS

| | | | |
|---|---|---|---|
| 3,157,499 | 11/1964 | Trusheim | 96/44 UX |
| 3,558,312 | 1/1971 | Fucko | 96/41 |
| 3,617,267 | 11/1971 | Kinney | 96/41 X |
| 3,649,273 | 3/1972 | Miller | 96/41 |
| 3,663,223 | 5/1972 | Camenzino | 96/41 X |
| 3,669,666 | 6/1972 | Kleitman | 96/41 |

*Primary Examiner*—Edward C. Kimlin
*Attorney, Agent, or Firm*—Nathan Edelberg; Robert P. Gibson; Jack W. Voigt

[57] ABSTRACT

A method is disclosed for preparing masks for photo etch purposes. Preselected circuit combinations are scribed in an opaque film supported by a translucent film. Beginning with the most simple circuit combination, the scribed opaque film is peeled away and the resultant circuit is photographed. The next most simple circuit combination of scribed film is peeled away and the new circuit is photographed. This stripping and photographing process is continued until all circuit combinations are photographed from a single art work.

1 Claim, 6 Drawing Figures

SEQUENTIAL PEELING FOR MASK PREPARATION FOR FABRICATION OF MICROWAVE CIRCUITS

DEDICATORY CLAUSE

The invention described herein may be manufactured, used, and licensed by or for the Government for Governmental purposes without payment to us of any royalty thereon.

BACKGROUND OF THE INVENTION

The standard procedure used to prepare a mask for fabrication of microwave circuitry consists of using a two layer polyethylene terephthalate (Mylar) film — one layer is photographically opaque, the other layer is translucent. The desired circuit is hand cut to required dimensions. The circuit outline is cut through the opaque layer of film and the unwanted portions are then removed from the surface. A single mask for each circuit is required. The mask designs are in different configurations depending on the frequency used, and the type of circuit desired. Accuracy is of prime importance in the preparation of these masks. If an existing mask needed modification in one or more given measurements an entirely new mask had to be cut. In cutting a new mask only slight differences in previously acceptable mechanical measurements results in another variable that must be dealt with to obtain the desired pattern. The method described herein utilizes one mask and redundant use to provide accurate fabrication of apertures for microwave circuits.

SUMMARY OF THE INVENTION

The instant method is for the preparation of masks used for photo etching where a parametric variation of certain critical dimensions is required. This parametric variation occurs when certain critical dimensions of the circuit must be obtained by empirical means. Only one mask is required for generating selected circuit combinations. Considerable time is saved in this multiple circuit-single mask procedure and the maintenance of the critical dimensions for each circuit made from the mask eliminates error inherent in repetitive scribing. For each circuit photographed, only the sections peeled away are changed and all other circuit portions remain exactly identical with preceeding features. In preparing the circuits, an opaque film is scribed with all required combinations of a circuit. The scribed film is peeled away to reveal the most simple circuit combination on a translucent substrate, which is then photographed. Subsequent steps involves stripping away successive portions of scribed film and photographing the new circuits until all combinations are photographed.

DESCRIPTION OF THE PREFERRED EMBODIMENT

Figure 1:
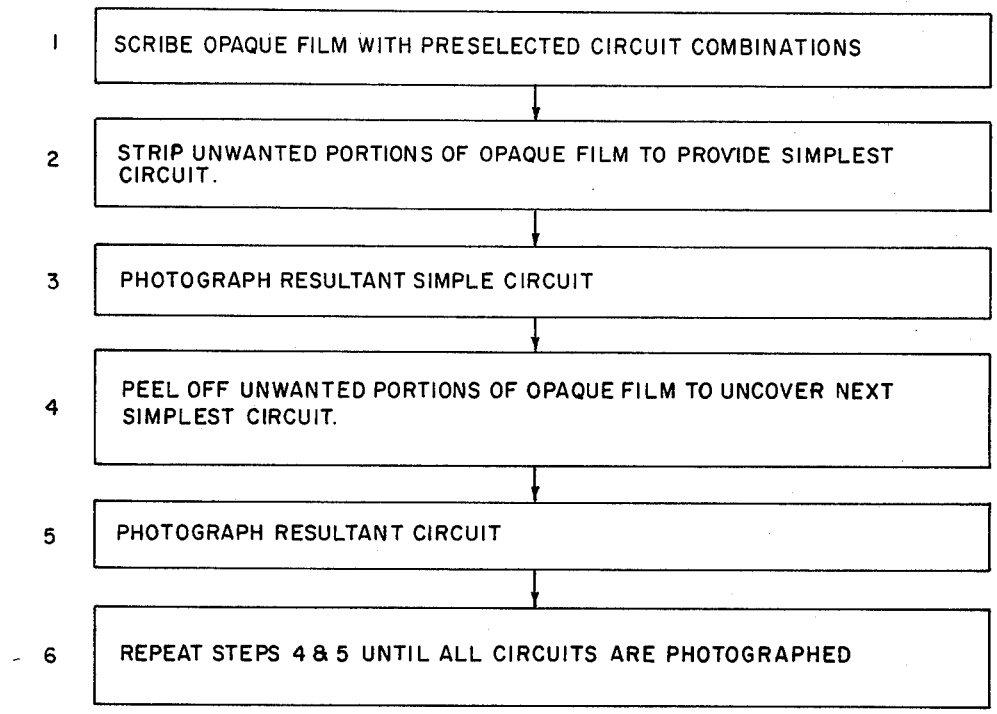
FIG. 1 is a flow diagram illustrating the various steps encountered in the improved techniques of the present invention.
Figure 2:
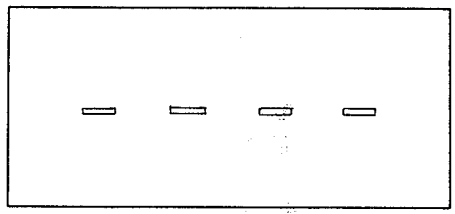
FIGS. 2A–2E are representative of sequentially produced apertures in accordance with the inventive method.
Figure 2:
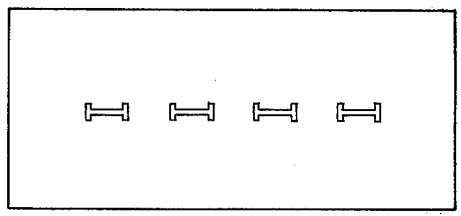
Figure 2:
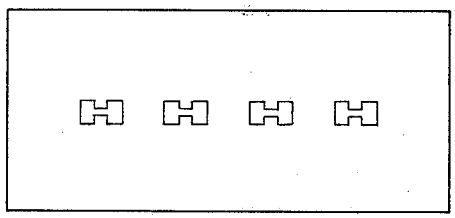
Figure 2:
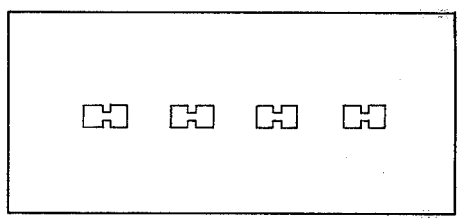
Figure 2:
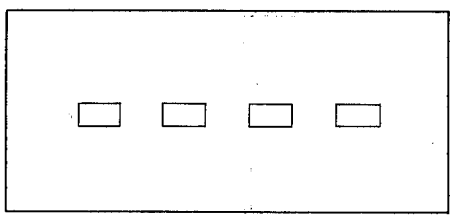

In the empirical design of a microwave circuit, often there are only a few dimensions of the total circuit which are critical to the performance required. To change any of these dimensions a new mask had to be prepared to obtain a workable circuit element. Several modifications on one basic design might occur before the final circuit would be acceptable. In accordance with a preferred embodiment of the inventive method a two layer polyethylene terephthalate (Mylar) film is used as a mask for producing several microwave circuits in the empirical design of a preferred circuit. In the polyethylene terephthalate film, one layer is photographically opaque and the other layer is translucent. As shown in the FIG. 1 flow diagram, the opaque film is cut to required dimensions and the translucent film thereunder is left intact. The desired circuit combinations may be hand cut using precision gauge blocks and reference straight edge or may be scribed with a coordinatograph. Unwanted portions of the opaque film are then sequentially peeled away from the translucent film surface, with the microwave circuit aperture being photographically recorded after removal of successive sections of the opaque film. Thus, the simplest scribed combination is stripped away from the translucent surface beneath. This aperture is photographed to provide the aperture shown typically as FIG. 2A. The next most simple circuit is obtained by again stripping away selected scribed portions and again photographing the substrate to obtain the aperture shown typically as FIG. 2B.

In a similar manner the photographs of subsequentially developed microwave circuit apertures are obtained until all preselected combinations are photographed. These may be as noted in FIGS. 2C, 2D, and 2E. These photographic images of respective circuit configurations are used in conventionally accepted ways well known in the art for printing the circuits on copper clad boards for use in microwave circuits.

Precision scribing of the art work insures that each circuit will be accurate in mechanical dimensions which dictate the electrical measurements that will be ultimately obtained from the finished product. Sequential stripping and photographing from a single art work allows all previously scribed dimensions to be identical. Only the edge stripped during successive steps will add changes to the electrical results. Thus, a microwave aperture or other circuit overlay can be empirically determined and accurately obtained with a minimum of art work preparation. In the event a previously obtained photographed circuit is desired or must be modified after several subsequent circuits have been made, an opaque film strip can be inserted and scribed to reverse the process and obtained the desired circuit.

Although a particular method of this invention has been illustrated, it is apparent that various modifications of the invention may be made by those skilled in the art without departing from the scope and spirit of the foregoing disclosure. Accordingly, the scope of the invention should be limited only by the claims appended hereto.

We claim:

1. In the preparation of masks having opaque and translucent layers of film for fabrication of microwave circuits, the method of sequentially peeling a single mask for redundant use and comprising the steps of:
   a. scribing a plurality of preselected empirically determined circuit combinations into a photographically opaque overlay film sheet without damaging a translucent substrate film;
   b. removing the most simple circuit of opaque film from the scribed sheet;

c. photographing the resultant simple circuit comprising the remaining opaque and translucent film sheets;
d. peeling away the next most simple scribed circuit portion;
e. photographing the resultant circuit; and
f. repeating steps (d) and (e) until all desired circuits are photographed for further reduction.

* * * * *